United States Patent [19]

Wei et al.

[11] E Patent Number: Re. 32,849

[45] Reissued Date of Patent: Jan. 31, 1989

[54] METHOD FOR FABRICATING MULTI-LAYER OPTICAL FILMS

[75] Inventors: David T. Wei, Malibu; Anthony W. Louderback, Ojai, both of Calif.

[73] Assignee: Litton Systems, Inc., Woodland Hills, Calif.

[21] Appl. No.: 751,218

[22] Filed: Jul. 2, 1985

Related U.S. Patent Documents

Reissue of:

[64] Patent No.: 4,142,958
Issued: Mar. 6, 1979
Appl. No.: 896,133
Filed: Apr. 13, 1978

[51] Int. Cl.[4] ..... C23C 14/46

[52] U.S. Cl. ..... 204/192.27; 204/298

[58] Field of Search ..... 204/192 R, 192 C, 192 P, 204/298, 192.26, 192.27

[56] References Cited

U.S. PATENT DOCUMENTS

| | | | |
|---|---|---|---|
| 3,247,392 | 4/1966 | Thelen | 250/226 |
| 3,895,602 | 7/1975 | Bobenrieth | 118/726 |
| 3,925,187 | 12/1975 | Bernard | 204/298 |
| 4,033,843 | 7/1977 | Krikorian et al. | 204/192 P |
| 4,093,349 | 6/1978 | Mills | 350/641 |

OTHER PUBLICATIONS

W. D. Westwood et al, "Fabrication of Optical Waveguides by Ion-Beam Sputtering", *J. Vac. Sci. Technol.*, vol. 13, pp. 104–106 (1976).

C. Misiano et al, "Co-Sputtered Optical Films," *Vacuum*, vol. 27, pp. 403–406 (1977).

W. Laznovsky, "Advances in Low-Energy Ion Beam Technology," *Research Development*, Aug. 1975, pp. 47–48, 50, 52, 54–55.

*Primary Examiner*—Aaron Weisstuch
*Attorney, Agent, or Firm*—Bright & Lorig

[57] ABSTRACT

A method for fabricating multiple layer interference optical films by ion beam sputtering, said films being used for mirrors in a ring laser apparatus. An ion beam strikes a target material obliquely, dislodging molecules of the target so that they can be deposited on a surface serving as a base for a multiple layer interference coating. The thickness of the coating is monitored so that the proper thickness of a given layer can be optimized to obtain the type of reflectance desired for a given light wave length. The surface to be coated is rotated during the deposition of the layer of target material. A stack of layers of alternating indices of refraction comprises the optical interference film. The coating process occurs inside of a vacuum chamber where the partial pressures of the gases are carefully controlled to insure the proper ion beam intensity and optimum stoichiometry of the deposited optical films. Prior to beginning the deposition of optical films, the ceramic substrate comprising the mirror base is bombarded by the ion beam at an oblique angle to remove surface anomalies and clean it.

22 Claims, 3 Drawing Sheets

8
10
6
4
12
16
14
17
3
34
27
32
2
26
28
22
24
20
22
30
A
B
102
103
104
C
9
7
18
5
D
C
13
11
36

METHOD FOR FABRICATING MULTI-LAYER OPTICAL FILMS

Matter enclosed in heavy brackets [ ] appears in the original patent but forms no part of this reissue specification; matter printed in italics indicates the additions made by reissue.

BACKGROUND OF THE INVENTION

The present invention relates to a sputtering apparatus and method for fabricating durable dielectric thin film optical coatings such as those commonly used in quarter wave stacks for laser mirrors.

In ring laser gyroscopes, one of the principal obstacles to overcome is the phenomena of frequency synchronization or lock-in between the oppositely propagating laser waves within the ring laser cavity. The phenomena of lock-in is fully explained in the test "Laser Applications" edited by Mote Ross, Academic Press, New York, 1971, in the chapter entitled, "Laser Gyroscope," at pages 148–153. The principal cause of lock-in is the phenomena of back scatter which occurs at the reflecting surfaces of the quarter wave stacks in the mirrors in the laser path. Back scatter is caused by anamolies and surface roughness in the reflective surfaces of the various layers of the quarter wave stacks.

Quarter wave stacks and their design are explained in detail in the Military Standardization Handbook entitled "Optical Design," MIL-HDBK-141, Oct. 5, 1962. Briefly, each layer or thin film dielectric coating in a quarter wave stack has a thickness of about one quarter of a wavelength of the light which it is designed to reflect. The number of layers which comprise the quarter wave stack depends on the degree of desired reflectance and the differences in refractive indices of the layers. To increase reflectance, the number of layers and/or the differences in refractive indices may be increased. For mirrors used in ring lasers, the quarter wave stacks generally consist of 17 to 25 quarter wave thin film optical layers deposited on a substrate. Each layer is typically from 500 to 800 Angstroms thick. The layers alternate between a material of high index of refraction and a material of low index of refraction. Typically, the high index material is tantalum pentoxide ($Ta_2O_5$) or titanium dioxide ($TiO_2$) and the low index material is silicon dioxide ($SiO_2$, i.e., quartz).

In order to minimize back scatter and absorption losses in the quarter wave stack, it is desirable to obtain amorphous coatings which are free of voids and which approach the density and refractive index of the bulk material from which the coatings are obtained. The goal is to get a molecule-by-molecule deposition of the coating and avoid a crystalline structure. Also, it is desired to avoid the formation of suboxides which may result from the lack of sufficient oxygen in the chamber.

Up until now the principal method of fabricating quarter wave stacks for ring laser mirrors has been to use an electron beam evaporation technique. A substrate on which a reflective stack is to be coated is located inside of a vacuum chamber with a sample of the bulk or target material which is to be deposited. An electron beam focussed on the sample material causes localized heating of the material to a point where molecules are evaporated off. These molecules then condense on the other surfaces located in the interior of the vacuum chamber, including the substrate which is being coated.

An electron beam has been used because of its capability of transferring sufficient thermal energy to a localized area of the target material. The kinetic energy of the electrons in the beam are converted to thermal energy when the beam is directed at the evaporate material. Molecules of the target material are heated to the point where molecules or groups of molecules are boiled off. This process of electron beam evaporation as a means of coating is thoroughly explained in the text, "Physical Vapor Deposition," distributed by Airco Temescal, 2850 7th Street, Berkeley, Calif., 1976.

One of the principal problems encountered in the electron beam evaporation technique is to coat layers of the quarter wave stack so that they approach the density of the bulk material from which they come. With this process, molecules of the target material condense on the substrate in such a manner that voids are left between them. The resulting coating is less dense than the bulk, which results in a difference in the layer's index of refraction. Because of the unpredictability of the final density, it is difficult to determine and to control the refractive indices of the stack.

Another problem with the electron beam technique has to do with the electron beam encountering impurities or air pockets in the target material. The high heat concentration results in small explosions which throw out larger chunks of multiple molecules and impurities which condense in the layer. These impurities increase back scatter and absorption in the laser mirror.

With the electron beam evaporation technique, parameters including temperature of the substrate, partial pressure of oxygen in the chamber, rate of deposition, and preparation of the target material are varied in attempts to control and improve the oxidation state, packing density, and degree of amorphousness of the stack. Generally, determining the proper variations and controlling them is very difficult. Typically, temperature of the substrate must be maintained at about 300 degrees Centrigrade in order to get a high density coating which is relatively free of voids and sufficiently amorphous. Until now, the electron beam evaporation technique has been refined to the point where it can consistently produce laser mirrors with losses from absorption and back scatter in the range of 0.1 percent.

Radio frequency (RF) sputtering has been tried in the past as a possible means of depositing thin films for laser mirrors. RF sputtering is explained in Physical Vapor Deposition, supra, at pages 106 to 108. Briefly, the method employes two plates with argon gas between them. On one plate is mounted a substrate to be coated and on the other is the target material. A high frequency, high voltage, a-c field between the plates ionizes the gas atoms causing them to move back and forth striking the target and knocking off molecules which are then deposited on the substrate.

Coatings made in this fashion have tended to be crystaline. Further, the process causes the coating to agglomerate (i.e., have a high surface roughness) and substrate temperature is nearly impossible to control accurately. RF sputtering is presently used for commercial applications, but generally not for specialized thin optical film applications.

SUMMARY OF THE INVENTION

It is the purpose of this invention to produce high quality quarter wave stacks for laser mirrors. Such mirrors have greatly increased packing densities and improved amorphous states in the individual layers, and impurities and surface anomalies are substantially reduced. This is accomplished by employing the technique of ion beam reactive sputtering to produce the dielectric coatings which make up the quarter wave stack mirrors. An important aspect of this invention is that the ion beam sputtering bombards a target material with ions. These ions strike the target with high momentum and break away individual molecules of the target material. The target molecules are then deposited on the substrate which comprises the base for the laser mirror. This technique results in a molecule-by-molecule deposition on the substrate for an improved amorphous coating and increased packing density. Also, the molecules adhere better to the substrate due to higher molecular velocities associated with ion beam sputtering.

Another important aspect of the invention is that it is an essentially cold process whereby the substrates being coated need not be maintained at high temperatures to achieve amorphous states and acceptable packing density levels. Further, because it is a cold process whereby ions break the molecules of the target material loose rather than boiling them away through localized applications of high energy, air voids and impurities in the target material do not cause small explosions with attendant breaking away of larger chunks of material which may deposit on the substrate. This in turn greatly reduces impurities and anomalies in the quarter wave stack layers.

Another important aspect of the invention is the presence of oxygen in the vacuum chamber where the substrate is being coated. The amount of oxygen flow available for oxidation of the molecules in the layers must be closely controlled to minimize the formation of suboxides which would otherwise constitute absorbtion impurities in the layers or coatings. This control, together with other features including the cold process aspect, greatly simplifies the process of coating laser mirrors and makes the final densities and refractive indices much more predictable.

A further aspect of the invention is the ability to bombard the base substrate with ions prior to the beginning of the deposition of the thin films. This bombarding of the substrate surface removes surface anomalies and also cleans the substrate surface to remove imperfections and impurities which might otherwise be detrimental to the mirror's reflectivity.

At present, the ion beam deposition method is capable of consistently producing quarter wave stack mirrors for lasers with losses in the range of 0.01 percent. This represents a significant improvement in the technology relating to thin film depositions, and particularly to the fabrication of quarter wave stacks for laser mirrors.

Other objects, features, and improvements accomplished by this invention will become apparent from the study of the figures and the detailed description of the invention.

DETAILED DESCRIPTION OF THE DRAWINGS

Figure 1:
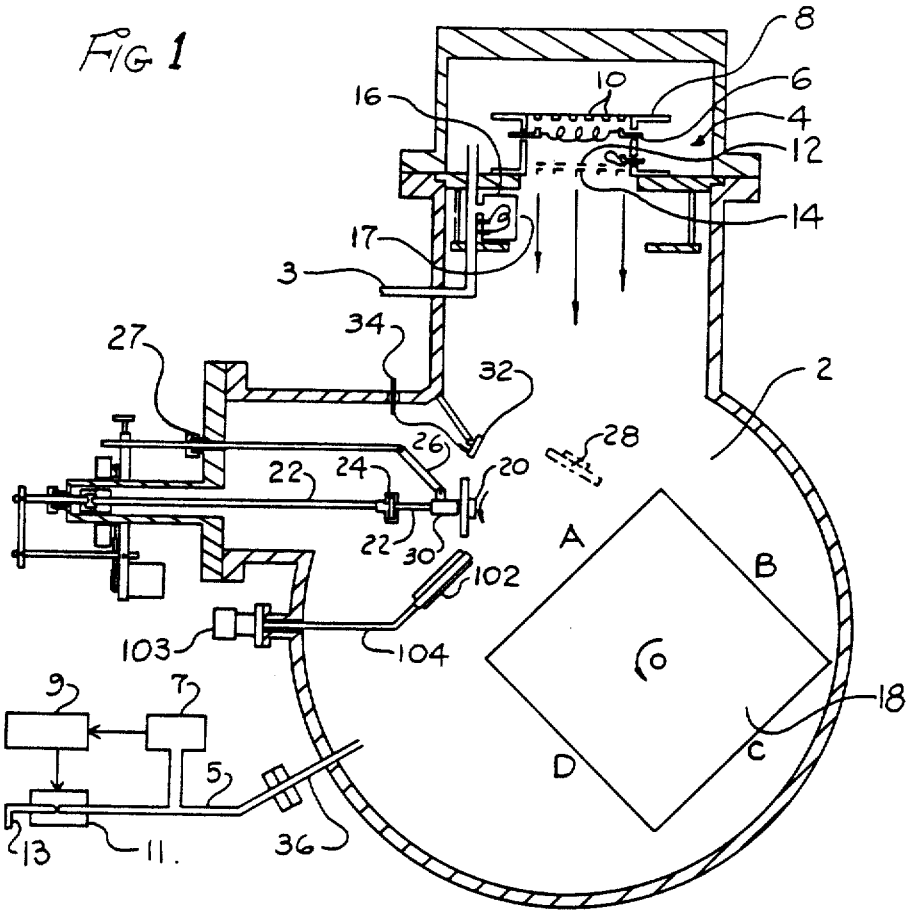
FIG. 1 is a partial cross section front view showing the inside of a vacuum chamber with the various apparatus necessary to accomplish ion beam sputtering for making interference optical films.

FIG. 1 shows a cross sectional view of a vacuum chamber apparatus used for fabricating interference optical films by ion beam sputtering. The vacuum chamber 2 contains argon at about $1.5\times10^{-4}$ torr. Argon enters the chamber through tube 3, the argon being released in the chamber in the area of the ion beam gun 4.

Oxygen is also present inside of the chamber to insure the proper stoichimetry of the layers deposited in the optical mirrors. The partial pressure of oxygen depends on whether the target material being coated has a high or low index of refraction. For high index materials, the partial pressure of oxygen is about $5\times10^{-5}$ torr, while it is about $3\times10^{-6}$ for low index materials.

The oxygen enters the chamber through tube 36. Because the partial pressure of oxygen is much less than the partial pressure of argon in the chamber, a special apparatus has been devised for measuring only the pressure of the oxygen. A pressure sensor 7 with a voltage output senses the pressure in the oxygen line 5. The pressure sensor output is transferred to a servo-valve controller 9, such as a Granville Phillips servo-valve controller. The servo valve controller opens and closes servo valve 11 to maintain the oxygen in line 5 at a pre-determined constant pressure. Oxygen is fed to servo-valve 11 through tube 13. The location of the pressure sensor 7 is far enough away from the chamber that it effectively only measures the pressure of oxygen being fed to the chamber, rather than the argon in the chamber.

Another possible way to control the amount of oxygen is to introduce gas mixed in the proper ratio through tube 3.

The ion beam gum 4 is a commercially available ion omitting aparatus generally known in the art as a Kauffman type ion beam gun. The gun's cathode 6 is a thermonic emitter, i.e., it emits electrons by passing an electric current through it which heats the wire. The cathode 6 emits electrons which are accelerated towards the anode 8. The electrons being accelerated from the cathode to the anode strike argon atoms and in so doing dislodge electrons from the argon. The results are positively charged argon ions which are accelerated away from the anode and towards the grids 12 and 14. Permanent bar magnets 10 attached to the anode introduce a magnetic field into the area between the cathode and the anode which cause the electrons traveling towards the anode to spiral. This spiral motion effectively increases the distance which the electrons travel in reaching the anode and thereby increases number of collisions between electrons and argon atoms.

In the space between the cathode 6 and anode 8, the electrons and argon ions create a glowing plasma. This plasma is at a high negative potential with the lower grid 14 being at about ground potential. The difference in voltage between the two grids 12 and 14 is from 500 to 1500 volts so that the argon ions passing between the two grids are accelerated at a high velocity away from the plasma and out of the gun. These ions constitute an ion beam.

Metal containers 16 contain electric wires that are maintained while hot so that they emit electrons. These emitted electrons are introduced into the beam through pin holes 17 in the container. This is to maintain the charge balance of the ion beam.

The beam intensity developed is about 100 milliamps and 1000 volts. Beam intensity depends upon the cathode current, voltage between the anode and cathode, and the partial pressures of the gases inside of the chamber 2. Presently, cathode current is about 20 amps while the voltage between the anode and cathode ranges from 40 to 60 volts. The argon partial pressure is $1.5\times10^{-4}$ torr. In addition, oxygen is introduced through the chamber with a partial pressure of about $5\times10^{-5}$ torr or $3\times10^{-6}$ torr, depending on whether high index of refraction materials or low index of refraction materials respectively are being deposited on a substrate.

A water cooled four target turret 18 is provided. A target is the base piece of material at which the ion beam is aimed so that atoms of the target material are dislodged and are coated onto a substrate. Targets are soldered to backing plates, and the surfaces A, B, C and D of the turret 18 are provided for mounting these backing plates. A separate backing plate may be mounted to each surface.

During the sputtering process, the targets often become too hot. Since the sputtering rate is temperature dependent, the higher the temperature of the target, the higher the rate of the deposition onto the substrate being coated. Therefore, in order to control the temperature of the targets, standard practice in sputtering is to have water lines inside of the turret 18 with circulating water to cool the target. How the turret functions and how water is circulated will become more apparent upon consideration of FIG. 2.

In the configuration shown in FIG. 1, the ion beam emanating from the gun 4 is directed at surface A of the turret, as indicated by the arrows. Atoms of the target material are dislodged and are coated onto the surfaces inside of the chamber 2. A ceramic substrate 20 comprises a base on which dielectric coatings are to be deposited. This substrate is mounted on the disk at the end of the shaft 22. The substrate forms the base for the ring laser mirror and it is located near the target inside of the chamber so that it will be in the main stream of the atoms dislodged from the target 18. The shaft 22 has a joint 24 so that the angle of the substrate may be varied by moving the bar linkage 26 in and out of the chamber. The bar linkage is allowed to slide in and out of the vacuum chamber by use of a hermetic seal which is commonly available and well known in the art. Further, by sliding the shaft 22 further into the chamber and adjusting the bar linkage accordingly, the substrate 20 may be placed directly in the stream of the ion beam and tiled such that the beam strikes the surface of the substrate. This position is illustrated by dashed lines 28.

A sleeve 30 is provided to connect the bar linkage 26 to the shaft 22. This sleeve permits the shaft to rotate while being supported by the bar linkage 26. During the coating process, the shaft is rotated at about 60 revolutions per minute. The apparatus for varying the position of the shaft and rotating it inside of the chamber are further illustrated in detail in FIG. 3.

A crystal quartz monitor 32 is provided inside the chamber near the substrate to monitor the thickness of a coating on the substrate. The monitor 32 measures thickness by measuring the increase in mass on the quartz due to the coating on its surface. The quartz crystal is connected to an oscillator circuit through wires 34. As the mass of the coating increases, the natural frequency of the oscillation circuit decreases. Frequency of the oscillation circuit is calibrated to yield a reading corresponding to the thickness of the coating deposited on the quartz. The thickness of the coating on the quartz corresponds to the thickness of the coating on the substrate 20. Such monitors are commercially available and are well known in the art.

Figure 2:
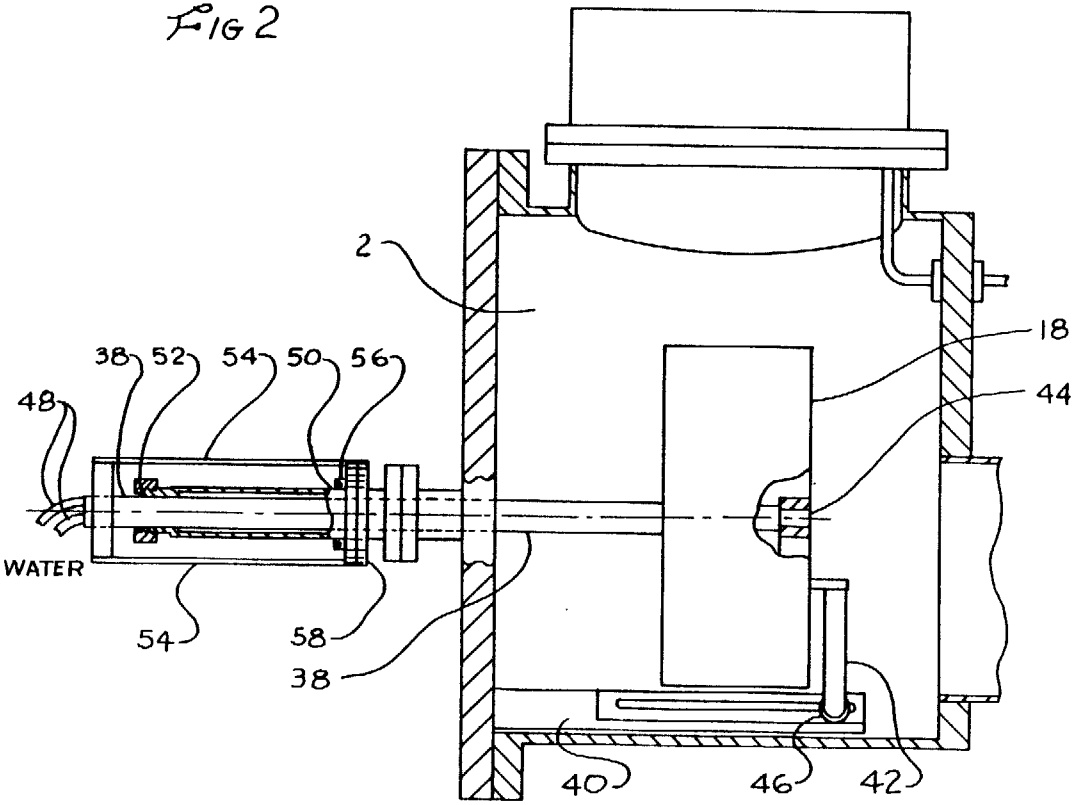
FIG. 2 shows a side view cross section of the vacuum chamber shown in FIG. 1 which illustrates how the turret on which the target materials are mounted fits and operates with the vacuum chamber.

FIG. 2 shows a side view of the vacuum chamber 2. As illustrated, the four sided water cooled turret 18 is supported along a shaft 38 and by a horizontal bar 40. A vertical bar 42 is attached by bearings 44 to the center of the turret and is connected to the horizontal bar 40 through a roller bearing 46. The arrangement as shown allows the horizontal bar 40 to provide support to the turret 18 while the shaft 38 is allowed to rotate the turret and slide in and out of the chamber while bar 40 supports the turret. Flexible tubes 48 enter the hollow shaft 38 outside of the chamber and provide circulating water to the mounting surfaces of the turret. The metal tube 50, fixedly attached to the side of the chamber, provides housing and support for the hollow shaft 38. An "O" ring seal 52 is provided as a seal between the housing tube 50 and the shaft 38. Outside handles 54 are fixedly attached to the shaft 38 and are supported at one end on ball bearings 56. The position of these handles relative to the index 58 provides information to the operator regarding the angular position of the turret inside of the chamber.

Figure 3:
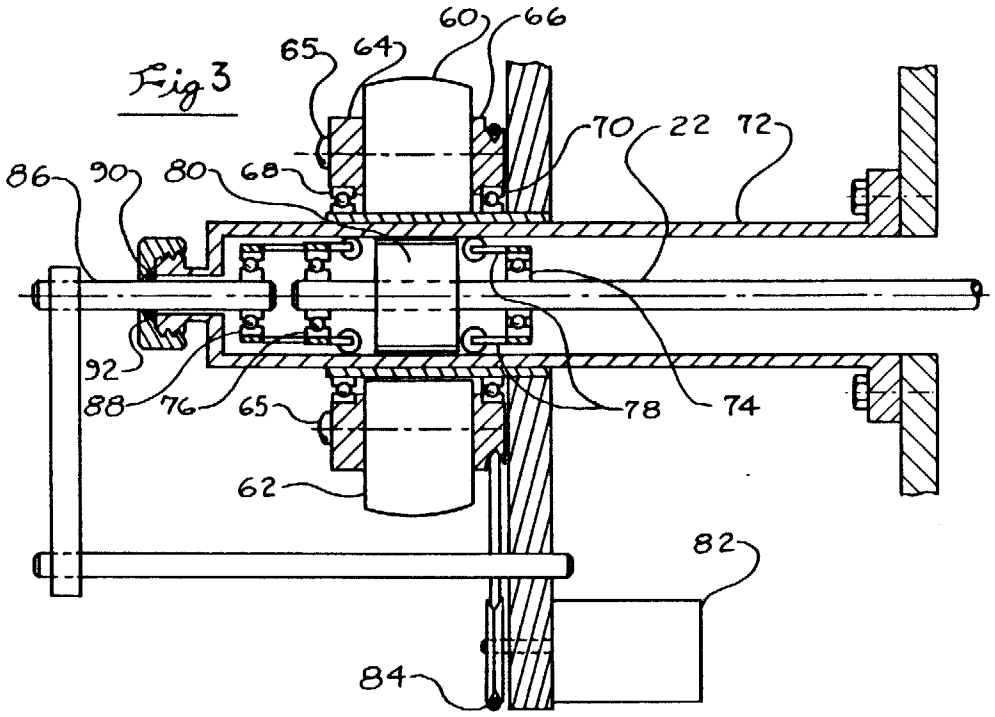
FIG. 3 is a cross sectional view of the apparatus used to manipulate and rotate the substrate mounting surface inside of the vacuum chamber with controls outside of the chamber.

Referring to FIG. 3, an apparatus is provided whereby the substrate mounted on the end of the shaft 22 can be rotated inside of the vacuum chamber 2. Bucking magnets 60 and 62 are clamped between a circular ring 64 and a pulley 66. The ring, bucking magnets, and pulley are fastened together by bolts 65 to form a bucking magnet assembly. Ball bearings 68 and 70 attach the bucking magnet assembly to the supporting tube housing 72. This housing 72 is fixedly attached to the outside of the chamber. The shaft 22 is secured inside of the housing 72 by ball bearings 74 and 76. The inner races of bearings 74 and 76 are attached to the shaft 22 while the outer races are attached to rollers 78. The roller 78 provides support to the shaft such that it does not touch the sides of the tubular housing 72 as the shaft 22 slides in an out of the chamber. Bearings 74 and 76 permit the shaft 22 to rotate while the rollers and tube housing remain stationary.

As the bucking magnets and pulley rotate around the tubular shaft 72, the magnetic field from magnets 60 and 62 rotates and exerts an angular force on an armature 80 which is fixedly attached to the shaft 22. This type of armature is a piece of highly permeable iron and is well known in the art. As the bucking magnet and pulley rotate, the substrate located inside of the chamber also rotates. An electric motor 82 is connected to the pulley by way of a "V" belt 84 to provide a constant drive to the shaft 22. Shaft 86 is connected to the inner race of ball bearing set 88 while the outer race is connected to the outer race of ball bearing set 76. This arrangement allows shaft 22 to rotate freely while shaft 86 remains stationary. However, as shaft 86 slides in and out of the tubular housing 72, shaft 22 is constrained to move with it. A threaded cap 90 secures an "O" ring seal 92 between the tubular housing 72 and the shaft 86 seals the vacuum chamber.

The apparatus described in the FIGS. 1, 2 and 3 is suitable for ion beam sputtering of many types. The process described here will be for deposition of thin film layers onto ceramic substrates to form a series or stack of quarter wave layers to reflect laser beams in ring laser gyroscopes. However, the process is not necessarily limited to the fabrication ring laser mirrors.

Referring again to FIG. 1, a ceramic substrate 20 mounted to the end of shaft 22 is positioned as shown by dashed lines 28 in the ion beam stream. The ion beam bombarding the surface of the substrate at an angle cleans it to remove impurities located on the surface and removes rough spots. This provides a cleaner and smoother surface and allows for a better thin film coating. The substrate is then retracted to the position shown in FIG. 1 and the target located on mounting surface A of the turret 18 is bombarded by the ion beam. Atoms which are dislodged from the target are coated on the exposed surfaces, including the substrate, located inside of the chamber 2.

A glass shield 102 is provided inside of the chamber. The shield is rotated into the position shown in FIG. 1 by the apparatus 103 located outside of the chamber which allows the vacuum chamber to remain sealed while allowing the shaft 104 which is attached to the shield to be rotated.

Targets that have been exposed to the atmosphere may have contaminants from handling or oxidation and other corrosion on their surfaces. Prior to coating a thin film, the targets are cleaned inside of the chamber by bombarding them with the ion beam and removing the oxidation and contamination. During this cleaning, the bar linkage 26 and the shaft 22 are manipulated such that the substrate 20 is positioned behind the glass shield 102. In this manner, contaminants and oxidation removed from the targets are prevented from depositing on the substrate surface.

A high index of refraction material, such as titanium dioxide, is the target material on surface A of the turret 18. As shown in FIG. 1, the ion beam strikes the target on surface A obliquely and dislodges atoms of the target material. Note that the substrate is positioned inside of the chamber in the main path of the target molecules which have been dislodged by the ion beam. The titanium dioxide target is bombarded by the ion beam until the layer deposited has an optical thickness of ¼ of a wave length of a laser beam. Because different laser beams may have different wave lengths, the proper thickness of the quarter wave layer may vary depending on particular design parameters. Proper layer thickness is calculated by the formula below:

$$\text{(layer thickness)} = \frac{\text{(laser beam wave length)}}{4\text{(layer index of refraction)}}$$

A low index of refraction target material such as silicon dioxide is attached to surface C of the turret. When the high index of refraction quarter wave layer is complete, the turret is rotated 180° and the ion beam obliquely bombards the target on surface C to deposit a low index of refraction quarter wave layer. Typically, a silicon dioxide layer is about 1,000 Angstroms thick, while a titanium dioxide layer is about 700 Angstroms thick.

This procedure is repeated until a stack of alternating layers of high and low index of refraction materials is deposited. The number of layers deposited depends on the differences in the indices of refraction of the materials and the amount of desired reflectance. Suitable high index of refraction materials are those having an index of refraction greater than 2.0. Low index materials generally have an index of less than 1.5. The materials discussed above, titanium dioxide and silicon dioxide, have indices of refraction of about 2.4 and 1.46 respectively.

Titanium dioxide silicon/dioxide mirrors typically have 21 alternating layers for maximum reflectance. Where mirrors are required which allow 0.05 to 0.01 percent transmittance, about 19 alternating layers are used. If the difference in index of refraction is less between layer materials, more layers are required to achieve the same reflectance.

Incidentally, the substrate forming the base of the ring laser mirror is generally an ultra low expansion ceramic material such as Zero-Dur, manufactured by Shott Glass, or Cervit, manufactured by Owens-Illinois. Other materials may be substituted for the substrate and for the alternating layers of high and low index of refraction materials used for targets and still be within the scope and intent of this invention.

What is claimed is:

1. A method of fabricating multiple layer optical films, *said multiple layer optical films comprising optical layers having different indices of refraction* comprising:

bombarding targets obliquely with an ion beam *produced by or derived from a Kaufman-type ion beam source* in a vacuum chamber to sputter deposit a plurality of optical film layers on a base;

controlling the atmosphere inside [of] the vacuum chamber to provide sufficient gas to sustain the ion beam and the proper amount of oxygen to accomplish proper stoichiometry of the thin films; and depositing multiple layers of different materials on said base by varying the targets being bombarded by the ion beam; and continuously rotating said base during the deposition of said multiple optical layers.

[2. The method described in claim 1 wherein said multiple layer films comprise optical layers having different indices of refraction.]

3. The method described in claim 1 further comprising bombarding said base obliquely with an ion beam prior to bombarding said targets to clean said base and to remove surface anomalies.

4. The method described in claim 1 wherein optical layers with indices of refraction greater than 2.0 and optical layers with indices of refraction less than 1.5 are deposited in alternating layers.

5. The method described in claim 4 wherein said optical layers with indices of refraction greater than 2.0 are titanium dioxide.

6. The method described in claim 4 wherein said optical layers with indices of refraction less than 1.5 are silicon dioxide.

7. The method described in claim 4 wherein said alternating layers are quarter wave layers.

8. The method described in claim 1 wherein the targets being bombarded by the ion beam are cooled to prevent excessive heat build-up and control sputtering rate.

9. The method described in claim 1 wherein said base is a low expansion ceramic substrate.

*10. The method described in claim 1 wherein said base and said multiple layer optical films form a mirror.*

*11. The method of claim 10 wherein said mirror is a ring laser gyroscope mirror.*

*12. The method of claim 11 wherein said ring laser gyroscope mirror has alternating layers of silicon dioxide and titanium dioxide.*

*13. The method of claim 10 wherein said mirror is a ring laser gyroscope mirror, and said method further comprises controlling the method parameters so that each of said optical films contains reduced impurities or surface anomalies of the kind that cause back scatter and absorption in laser mirrors, and is free of voids.*

*14. The method described in claim 1 wherein said base and said multiple layer optical film form a quarter wave stack mirror for use with a laser, said mirror having at least two optical layers with substantially different indices of refraction.*

*15. The method of claim 14 wherein said mirror is a ring laser gyroscope mirror.*

*16. The method of claim 15 wherein said ring laser gyroscope mirror has alternating layers of silicon dioxide and titanium dioxide.*

*17. The method of claim 14 wherein said mirror is a ring laser gyroscope mirror, and wherein said method further comprises controlling the method parameters so that each of said optical films has reduced impurities or surface anomalies of the kind that cause back scatter and absorption in laser mirrors, and is free of voids.*

*18. A method of fabricating multiple layer optical films, said multiple layer optical films comprising at least two optical layers having different indices of refraction, in alternating layers, comprising:*

*bombarding at least two targets comprising materials having different indices of refraction obliquely with an ion beam produced by or derived from Kaufman-type ion beam source in a vacuum chamber to sputter deposit a plurality of optical film layers comprising said materials in alternating layers on a base;*

*controlling the atmosphere inside of the vacuum chamber to provide sufficient gas to sustain the ion beam and the proper amount of oxygen to accomplish proper stoichiometry of the thin films;*

*depositing multiple layers of said materials having different indices of refraction on said base by varying the targets being bombarded by the ion beam; and*

*continuously rotating said base during the deposition of said multiple optical layers.*

*19. The method of claim 1 or claim 3 or claim 4 or claim 5 or claim 6 or claim 7 or claim 8 or claim 9 or claim 10 or claim 12 or claim 13 further comprising controlling the method parameters so that each of said optical films has a predictable, predetermined density and refractive index, reduced impurities or surface anomalies of the kind that cause back scatter and absorption in laser mirrors, is amorphous, and is free of voids.*

*20. The method of claim 1 or claim 3 or claim 4 or claim 5 or claim 6 or claim 7 or claim 8 or claim 9 or claim 14 or claim 18 further comprising controlling the method parameters so that each of said optical films has a predictable, predetermined density and refractive index, and reduced impurities or surface anomalies of the kind that cause back scatter and absorption in laser mirrors.*

*21. The method of claim 1 or claim 3 or claim 4 or claim 5 or claim 6 or claim 7 or claim 8 or claim 9 or claim 14 or claim 18 further comprising controlling the method parameters so that each of said optical films has a predictable, predetermined density and refractive index, reduced impurities or surface anomalies of the kind that cause back scatter and absorption in laser mirrors and is amorphous.*

*22. The method of claim 1 or claim 3 or claim 4 or claim 5 or claim 6 or claim 7 or claim 8 or claim 9 or claim 14 or claim 18 further comprising controlling the method parameters so that each of said optical films has a predictable, predetermined density and refractive index, reduced impurities or surface anomalies of the kind that cause back scatter and absorption in laser mirrors and is free of voids.*

* * * * *